United States Patent [19]
Oh

[11] Patent Number: 5,905,689
[45] Date of Patent: May 18, 1999

[54] COLUMN DECODER ARRAY DEVICE

[75] Inventor: Young Nam Oh, Ichon, Rep. of Korea

[73] Assignee: Hyundai Electronics Industries Co., Ltd., Kyoungki-do, Rep. of Korea

[21] Appl. No.: 08/959,788

[22] Filed: Oct. 29, 1997

[30] Foreign Application Priority Data

Oct. 31, 1996 [KR] Rep. of Korea ...................... 96-50630

[51] Int. Cl.⁶ .................................................. G11C 8/00
[52] U.S. Cl. .............................. 365/230.06; 365/230.03; 365/194
[58] Field of Search ............................. 365/230.06, 194, 365/230.03

[56] References Cited

U.S. PATENT DOCUMENTS

| | | | |
|---|---|---|---|
| 4,779,227 | 10/1988 | Kurafuji et al. | |
| 5,566,126 | 10/1996 | Magome | 365/230.06 |
| 5,625,595 | 4/1997 | Ikeda | 365/194 |
| 5,742,554 | 4/1998 | Fujioka | 365/222 |

*Primary Examiner*—David Nelms
*Assistant Examiner*—Hoai V. Ho
*Attorney, Agent, or Firm*—Thelen, Reid & Priest, L.L.P.

[57] ABSTRACT

A column decoder array device used in a synchronous graphic random access memory, in which column decoders adapted to simultaneously operate for a block write function are arranged in a laterally symmetrical manner or in a shifted manner, so as to effectively reduce the intensity of peak current.

4 Claims, 6 Drawing Sheets

COLUMN DECODER ARRAY DEVICE

BACKGROUND OF THE INVENTION

1. Field of the Invention

The present invention relates to a column decoder array device used in semiconductor memory devices, and more particularly to a column decoder array device used in a synchronous graphic random access memory (SGRAM), in which column decoders adapted to simultaneously operate for a block write function are arranged in a laterally symmetrical manner or in a shifted manner, so as to effectively reduce the intensity of peak current.

2. Description of the Prior Art

Generally, write operations performed in SGRAM devices include a normal write operation and a block write operation. In the block write mode, an increased number of cells in a SGRAM device perform a write operation, as compared to that of the normal write mode. For instance, in the case of an 8M SGRAM (X32), it is possible to simultaneously write 32 bits in a normal write mode whereas it is possible to simultaneously write up to 256 bits in a block write mode.

In connection with such a block write operation, however, conventional column decoder array devices involve a problem in that an increase in peak current results because an increased number of column decoders operate simultaneously.

SUMMARY OF THE INVENTION

Therefore, an object of the invention is to provide a column decoder array device used in a SGRAM, in which column decoders adapted to simultaneously operate for a block write function are arranged in a laterally symmetrical manner or in a shifted manner, thereby effectively reducing the intensity of peak current.

In accordance with the present invention, this object is accomplished by providing a column decoder array device used in a semiconductor memory device comprising a plurality of column decoders adapted to transmit data from bit line sense amplifiers to an input or output line, further comprising: column decoder enable means for receiving a delayed column address strobe signal and delayed block select address signals, thereby generating a control signal for enabling a column decoder array associated with a bank corresponding to the received signals; first decoding means for receiving a normal pre-decoding enable signal, an external column address enable signal, an internal column address enable signal, external column address signals and internal column address signals, thereby generating control signals for pre-decoding a first column address group; second decoding means for receiving the normal pre-decoding enable signal, a block write pre-decoding enable signal, a column address masking enable signal, the external column address enable signal, an internal column address enable signal, an external column address signal and an internal column address signal, thereby generating a control signal for predecoding a second column address group; and column decoder group circuit for receiving the output signal from the column decoder enable means, the output signals from the first decoding means and the output signal from the second decoding means, thereby generating a control signal for transmitting data from the bit line sense amplifiers to the input or output line.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
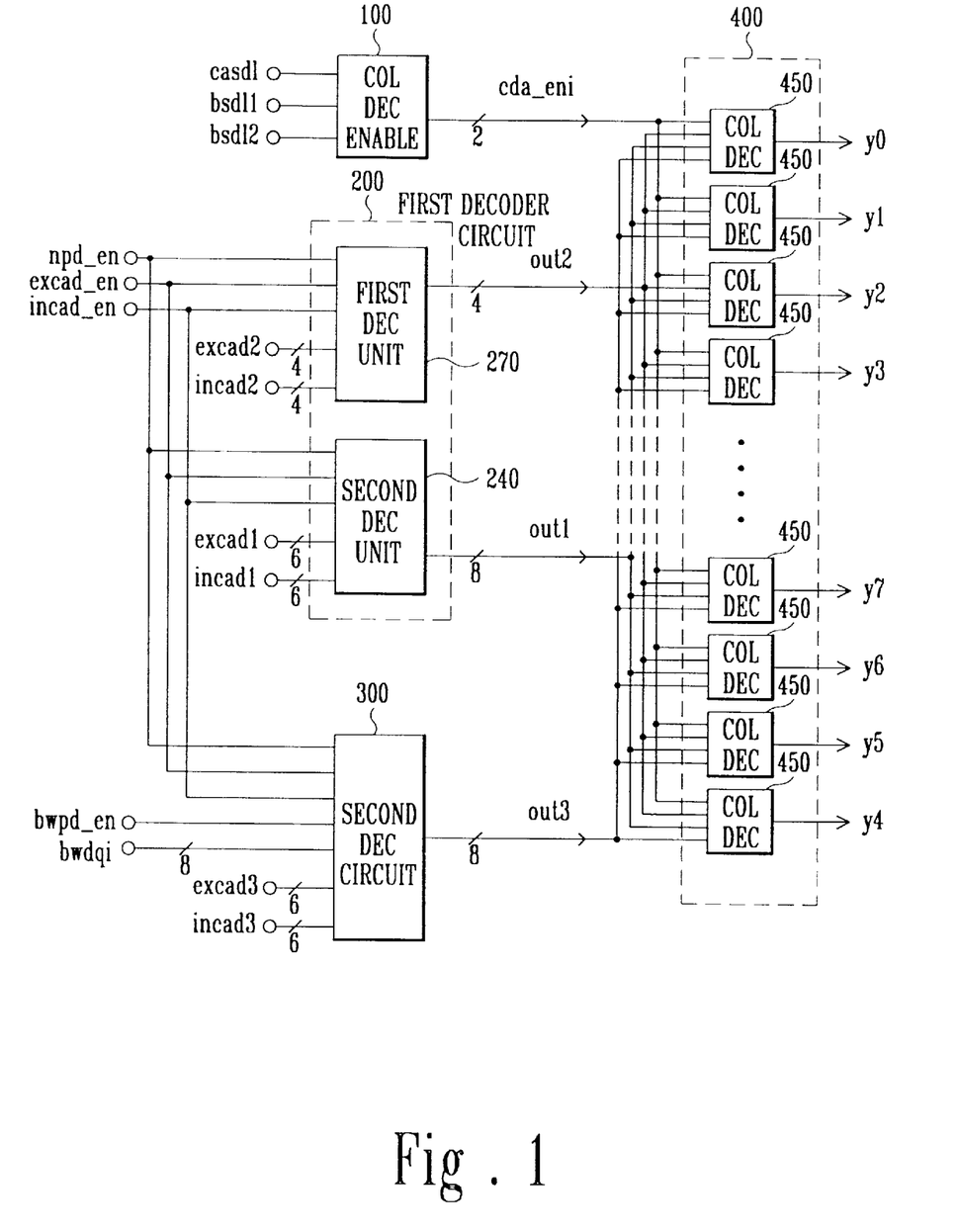
FIG. 1 is a block diagram illustrating a column decoder array device according to an embodiment of the present invention.

FIG. 1 illustrates a column decoder array device according to an embodiment of the present invention. As shown in FIG. 1, the column decoder array device of the present invention includes a column decoder enable circuit 100, a first decoder circuit 200 for pre-decoding a first column address group, a second decoder circuit 300 for pre-decoding a second column address group, and a column decoder group circuit 400 coupled at its input to outputs of the column decoder enable circuit 100, first decoder circuit 200 and second decoder circuit 300. The column decoder enable circuit 100 serves to receive a delayed column address strobe signal "casdl", and delayed block select address signals "bsdl1" and "bsdl2", thereby generating a control signal "cda_en0" or "cda_en1" for enabling a column decoder array associated with a bank corresponding to the received signals. The first decoder circuit 200, which is adapted to pre-decode the first column address group, receives a normal pre-decoding enable signal "npd_en", an external column address enable signal "excad_en", an internal column address enable signal "incad_en", external column address signals "excad1" and "excad2" and internal column address signals "incad1" to "incad2", thereby generating output signals "out1" and "out2". This first decoder circuit 200 includes a first decoder unit 240, generating the output signal "out1" and a second decoder unit 270, generating the output signal "out2". The second decoder circuit 300 has a configuration for pre-decoding the second column address group and a configuration for pre-decoding inputs dq0 to dq7 associated with a column address masking. The second decoder circuit 300 receives a normal pre-decoding enable signal "npd_en", a block write pre-decoding enable signal "bwpd_en", a column address masking enable signal "bwdqi", an external column address enable signal "excad_en", an internal column address enable signal "incad_en", an external column address signal "excad3" and an internal column address signal "incad3", thereby generating an output signal "out3". The column decoder group circuit 400 receives the output signal "cda_eni" from the column decoder enable circuit 100, the output signals "out1" and "out2" from the first decoder circuit 200 and the output signal "out3" from the second decoder circuit 300, so that column decoders 450 thereof generate output signals yi (y0 to y255), respectively.

For the simplification of description, the column decoder array of the present invention is described as being associated with one bank, namely the eight column addresses and the eight inputs/outputs (eight dqi's).

Figure 2:
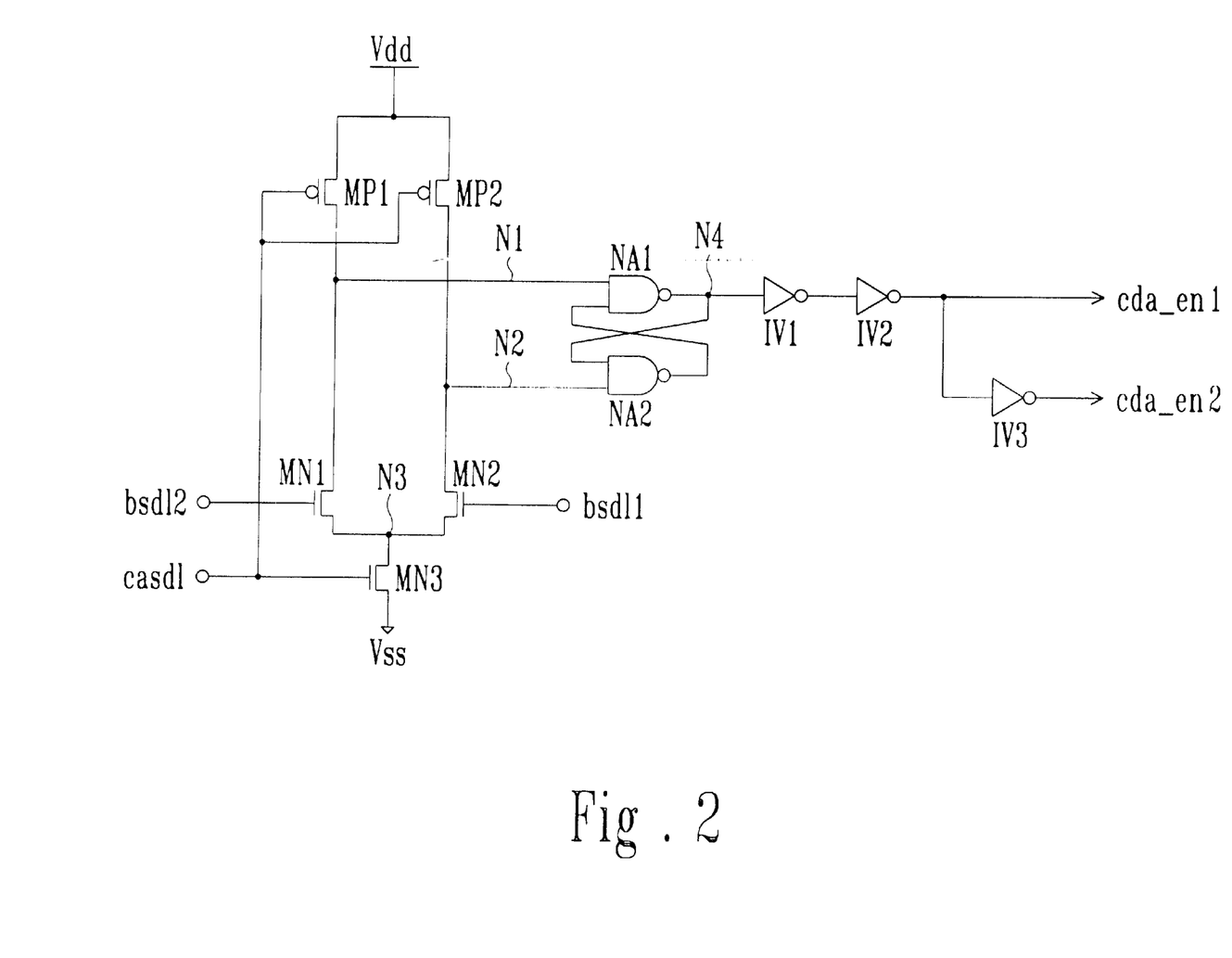
FIG. 2 is a circuit diagram illustrating a column decoder enable circuit shown in FIG. 1.

FIG. 2 is a circuit diagram illustrating the column decoder enable circuit 100 shown in FIG. 1.

As shown in FIG. 2, the column decoder enable circuit 100 includes a first PMOS transistor MP1 connected in series between a supply voltage source Vdd and a first node N1, a second PMOS transistor MP2 connected in series between the supply voltage source Vdd and a second node N2, a first NMOS transistor MN1 coupled between the first node N1 and a third node N3, a second NMOS transistor MN2 coupled between the second and third nodes N2 and N3, and a third NMOS transistor MN3 coupled between the third node N3 and a ground source Vss. A signal "casdl", which is a delayed column address strobe signal, is applied to the gate of the first PMOS transistor MP1. The signal "casdl" is also applied to the gates of the second PMOS transistor MP2 and third NMOS transistor MN3. A signal "bsdl2", a delayed bank select address signal, is applied to the gate of the first NMOS transistor MN1. A signal "bsdl1", a delayed bank select address signal, is applied to the gate of the second NMOS transistor MN2. The first PMOS transistor MP1, first NMOS transistor MN1 and third NMOS transistor MN3 cooperate to generate a bank-0 signal which is to be applied to the first node N1. The second PMOS transistor MP2, second NMOS transistor MN2 and third NMOS transistor MN3 cooperate to generate a bank-1 signal which is to be applied to the second node N2. The column decoder enable circuit 100 also includes a first NAND latch NA1 coupled at its set terminal to the first node N1 and adapted to receive the bank-0 signal and a second NAND latch NA2 coupled at its reset terminal to the second node N2 and adapted to receive the bank-1 signal. The first NAND latch NA1 is also coupled at its reset terminal to the output terminal of the second NAND latch NA2 and at its output terminal to a fourth node N4. The fourth node N4 is also coupled to the set terminal of the second NAND latch NA2. The column decoder enable circuit 100 further includes three buffers IV1 to IV3 connected in series to the fourth node N4. By such configuration, the column decoder enable circuit 100 generates, as a final output signal, a column decoder array enable signal "cda_en0" or "cda_en1" at the second buffer IV2 or at the third buffer IV3. The bank-0 signal from the first node N1 is switched to a low logic level when the signals "casdl" and "bsdl1" are clock-synchronized together, thereby generating pulses, respectively. In this state, the output signal "cda_en0" has a low logic level. Similarly, the bank-0 signal from the second node N2 is switched to a low logic level when the signals "casdl" and "bsdl2" are clock-synchronized together, thereby generating pulses, respectively. In this state, the output signal "cda_en1" has a low logic level.

Figure 3:
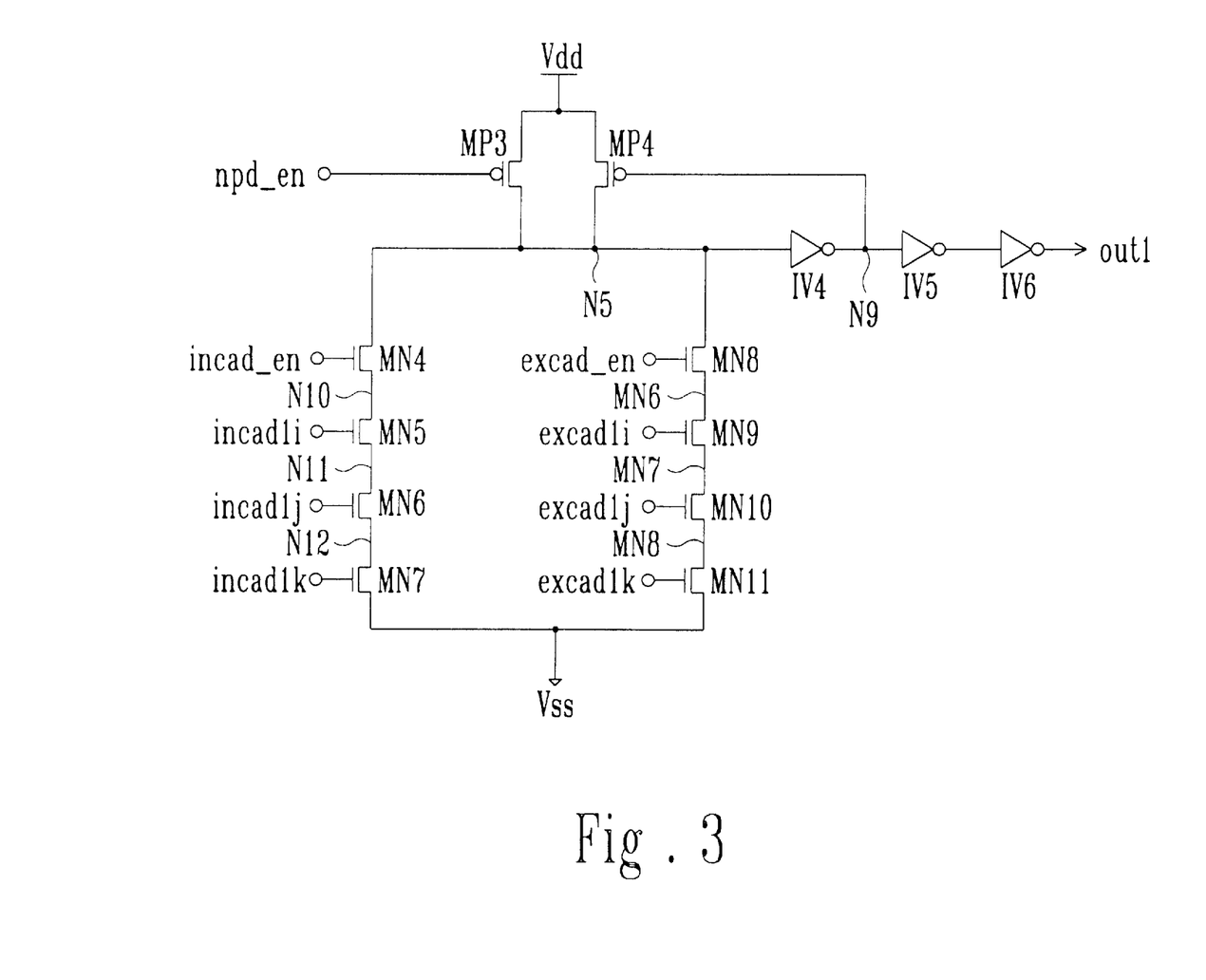
FIG. 3 is a circuit diagram illustrating a first decoder unit included in a first decoder circuit shown in FIG. 1.

FIG. 3 is a circuit diagram illustrating the first decoder unit 240 which is included in the first decoder circuit 200 shown in FIG. 1. The first decoder unit 240 carries out a desired decoding operation when a normal pre-decoding enable signal "npd_en", an external column address enable signal "excad_en", an internal column address enable signal "incad_en", external column address signals "excad1$i$" to "excad1$k$" and internal column address signals "incad1$i$" to "incad1$k$" are clock-synchronized together. As shown in FIG. 3, this first decoder unit 240 includes a third PMOS transistor MP3 connected in series between the supply voltage source Vdd and a fifth node N5 and adapted to receive the normal pre-decoding enable signal "npd_en" at its gate, a fourth NMOS transistor MN4 coupled between the fifth node NS and a tenth node N10 and adapted to receive the internal column address enable signal "incad_en" at its gate, a fifth NMOS transistor MN5 coupled between the tenth node N10 and an eleventh node N11 and adapted to receive the internal column address signal "incad1$i$" at its gate, a sixth NMOS transistor MNG coupled between the eleventh node N11 and a twelfth node N12 and adapted to receive the internal column address signal "incad1$j$" at its gate, and a seventh NMOS transistor MN7 coupled between the twelfth node N12 and the ground source Vss and adapted to receive the internal column address signal "incad1$k$" at its gate. The third PMOS transistor MP3, the fourth NMOS transistor MN4, the fifth NMOS transistor MN5, the sixth NMOS transistor MN6 and the seventh NMOS transistor MN7 cooperate to generate an output signal having a low logic level in response to an internal column address enable state. This signal is applied to the fifth node N5. The first decoder unit 240 also includes three buffers IV4 to IV6 connected in series to the fifth node N5. The first decoder unit 240 generates, as a final output signal, a signal "out1" via the buffers IV4 to IV6, based on the signal applied to the fifth node N5. The first decoder unit 240 also includes an eighth NMOS transistor MN8 coupled between the fifth node N5 and a sixth node N6 and adapted to receive the external column address enable signal "excad_en" at its gate, a ninth NMOS transistor MN9 coupled between the sixth node N6 and a seventh node N7 and adapted to receive the external column address signal "excad1$i$" at its gate, a tenth NMOS transistor MN10 coupled between the seventh node N7 and an eighth node N8 and adapted to receive the external column address signal "excad1$j$" at its gate, and an eleventh NMOS transistor MN11 coupled between the eighth node N8 and the ground voltage source Vss and adapted to receive the external column address signal "excad1$k$" at its gate. The third PMOS transistor MP3, the eighth NMOS transistor MN8, the ninth NMOS transistor MN9, the tenth NMOS transistor MN10 and the eleventh NMOS transistor MN11 cooperate to generate an output signal having a low logic level in response to an external column address enable state. This signal is applied to the fifth node N5. The first decoder unit 240 generates, as a final output signal, a signal "out1" based on the signal applied to the fifth node N5. The first decoder unit 240 further includes a fourth PMOS transistor MP4 connected between the supply voltage source vdd and fifth node N5 and adapted to receive, at its gate, an output signal from the buffer IV4 which is fed back via a ninth node N9. The reason why the fourth PMOS transistor MP4 is used is to prevent a floating phenomenon from occurring at the fifth node N5 after input signals having the form of pulses are enabled in response to their clock synchronization.

Figure 4:
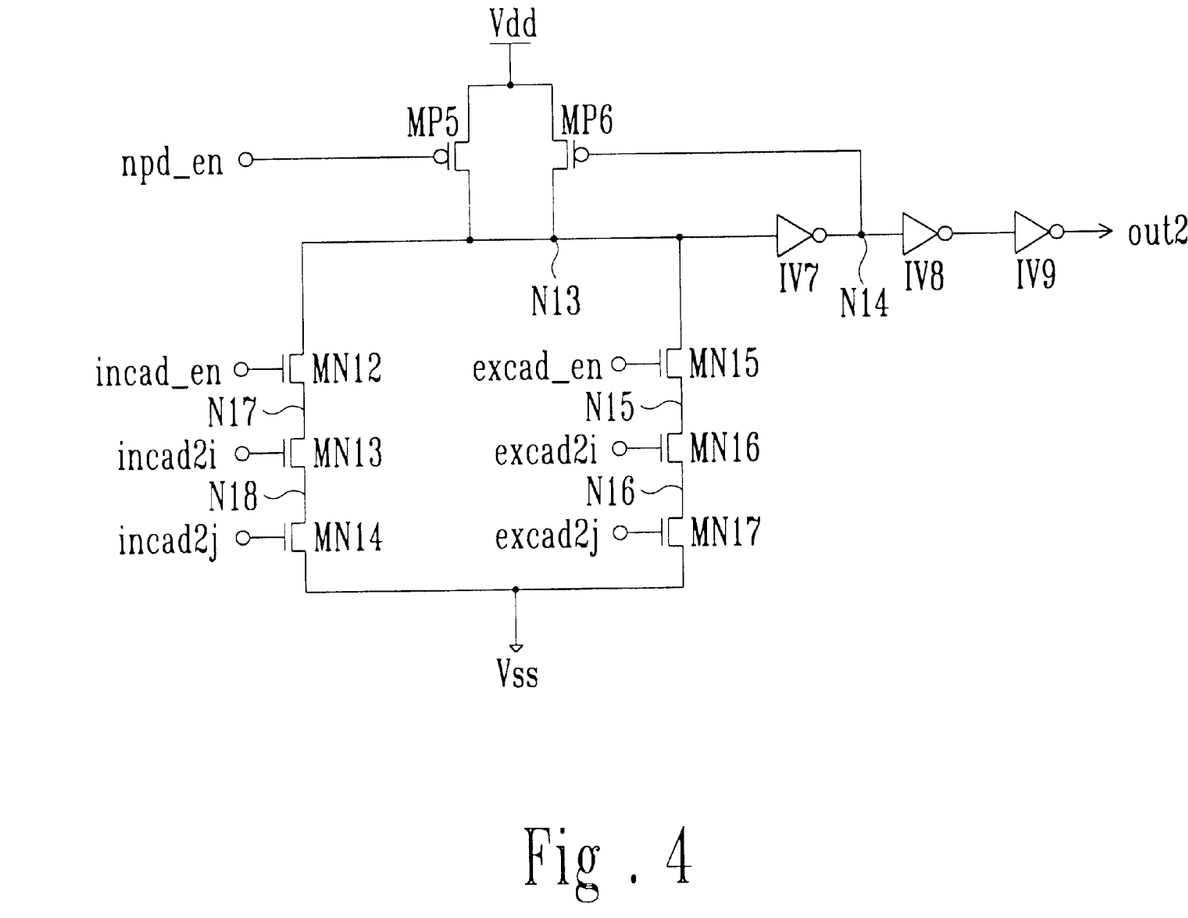
FIG. 4 is a circuit diagram illustrating a second decoder unit included in the first decoder circuit shown in FIG. 1.

FIG. 4 is a circuit diagram illustrating the second decoder unit 270 which is included in the first decoder circuit 200 shown in FIG. 1. The second decoder unit 270 carries out a desired decoding operation when a normal pre-decoding enable signal "npd_en", an external column address enable signal "excad_en", an internal column address enable signal "incad_en", external column address signals "excad2$i$" to "excad2$j$" and internal column address signals "incad2$i$" to "incad2$j$" are clock-synchronized together. As shown in FIG. 4, this second decoder unit 270 includes a fifth PMOS transistor MP5 which is connected in series between the supply voltage source Vdd and a thirteenth node N13 and adapted to receive the normal pre-decoding enable signal "npd_en" at its gate, a twelfth NMOS transistor MN12 coupled between the thirteenth node N13 and a seventeenth node N17 and adapted to receive the internal column address enable signal "incad_en" at its gate, a thirteenth NMOS transistor MN13 coupled between the seventeenth node N17 and an eighteenth node N18 and adapted to receive the internal column address signal "incad2$i$" at its gate, and a fourteenth NMOS transistor MN14 coupled between the eighteenth node N18 and the ground voltage source Vss and adapted to receive the internal column address signal "incad2j" at its gate. The fifth PMOS transistor MP5, the twelfth NMOS transistor MN12, the thirteenth NMOS transistor MN13 and the fourteenth NMOS transistor MN14 cooperate to generate an output signal having a low logic level in response to an internal column address enable state. This signal is applied to the thirteenth node N13. The second decoder unit 270 also includes three buffers IV7 to IV9 connected in series to the thirteenth node N13. The second decoder unit 270 generates, as a final output signal, a signal "out2", via the buffers IV7 to IV9, based on the signal applied to the thirteenth node N13. The second decoder unit 270 also includes a fifteenth NMOS transistor MN15 coupled between the thirteenth node N13 and a fifteenth node N15 and adapted to receive the external column address enable signal "excad_en" at its gate, a sixteenth NMOS transistor MN16 coupled between the fifteenth node N15 and a sixteenth node N16 and adapted to receive the external column address signal "excad2i" at its gate, and a seventeenth NMOS transistor MN17 coupled between the sixteenth node N16 and the ground voltage source Vss and adapted to receive the external column address signal "excad2j" at its gate. The fifth PMOS transistor MP5, the fifteenth NMOS transistor MN15, the sixteenth NMOS transistor MN16 and the seventeenth NMOS transistor MN17 cooperate to generate an output signal having a low logic level in response to an external column address enable state. This signal is applied to the thirteenth node N13. The first decoder unit 240 generates, as a final output signal, a signal "out2" via the buffers IV7 to IV9, based on the signal applied to the thirteenth node N13. The second decoder unit 270 further includes a sixth PMOS transistor MP6 connected between the supply voltage source Vdd and thirteenth node N13 and adapted to receive, at its gate, an output signal from the buffer IV7 which is fed back via a fourteenth node N14. The reason why the sixth PMOS transistor MP6 is used is to prevent a floating phenomenon from occurring at the thirteenth node N13 after input signals having the form of pulses are enabled in response to their clock synchronization.

Figure 5:
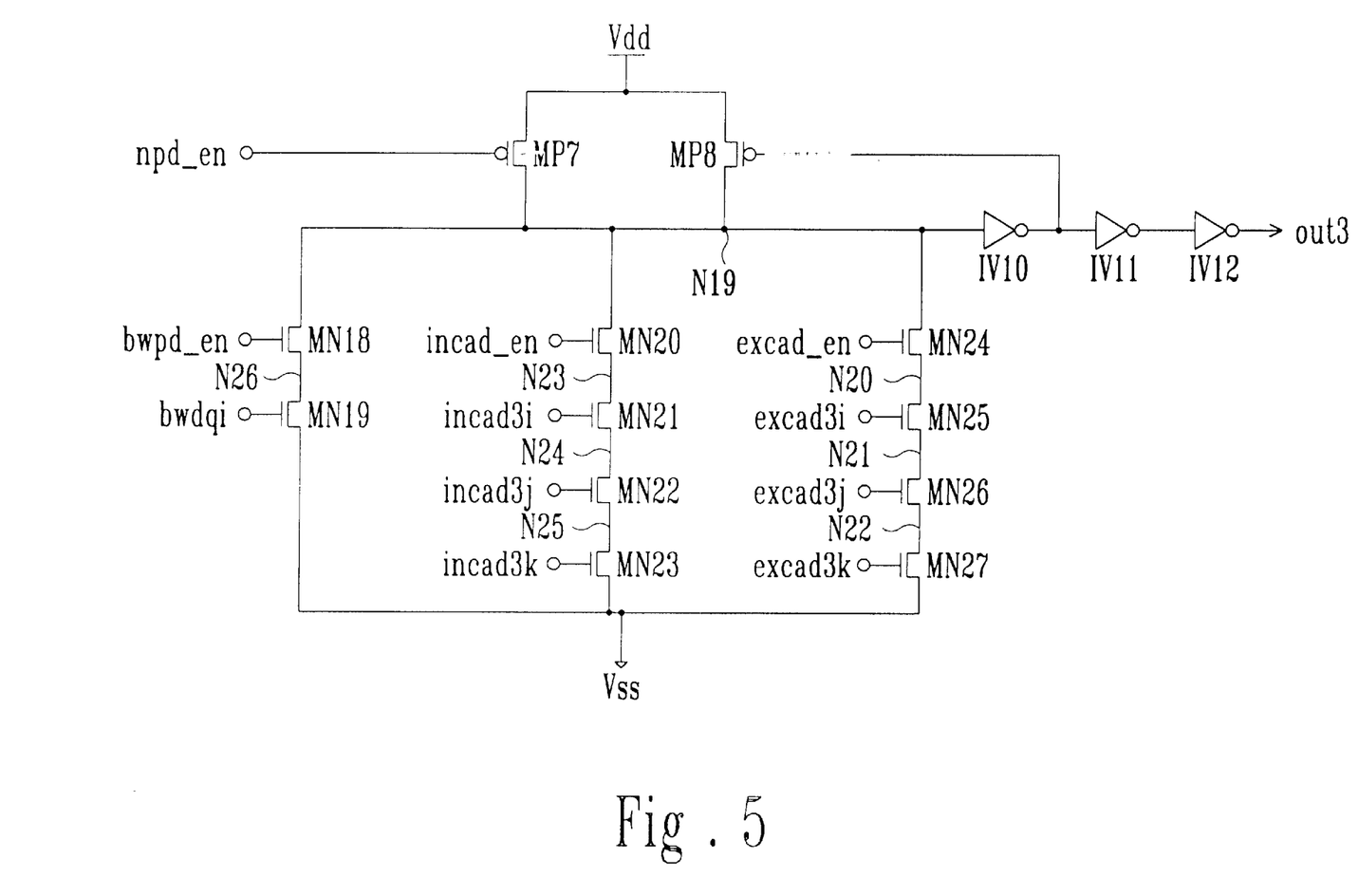
FIG. 5 is a circuit diagram illustrating a second decoder circuit shown in FIG. 1.

FIG. 5 is a circuit diagram illustrating the second decoder circuit 300 shown in FIG. 1. The second decoder circuit 300 carries out a desired decoding operation when a normal pre-decoding enable signal "npd_en", a block write pre-decoding enable signal "bwpd_en", a column address masking enable signal "bwdqi", an external column address enable signal "excad_en", an internal column address enable signal "incad_en", external column address signals "excad3i" to "excad3k" and internal column address signals "incad3i" to "incad3k" are clock-synchronized together. As shown in FIG. 5, this second decoder circuit 300 includes a seventh PMOS transistor MP7 connected in series between the supply voltage source Vdd and a nineteenth node N19 and adapted to receive the normal pre-decoding enable signal "npd_en" at its gate, an eighteenth NMOS transistor MN18 coupled between the nineteenth node N19 and a twenty-six node N26 and adapted to receive the block write pre-decoding enable signal "bwpd_en" at its gate, and a nineteenth NMOS transistor MN19 coupled between the twenty-sixth node N26 and the ground voltage source Vss and adapted to receive the column address masking enable signal "bwdqi" at its gate. The seventh PMOS transistor MP7, the eighteenth NMOS transistor MN18 and the nineteenth NMOS transistor MN19 cooperate to generate an output signal having a low logic level in response to a block write column address masking state. This signal is applied to the nineteenth node N19. The second decoder circuit 300 also includes three buffers IV10 to IV12 connected in series to the nineteenth node N19. The second decoder circuit 300 generates, as a final output signal, a signal "out3" via the buffers IV10 to IV12, based on the signal applied to the nineteenth node N19. The second decoder circuit 300 further includes a twentieth NMOS transistor MN20 coupled between the nineteenth node N19 and a twenty-third node N23 and adapted to receive the internal column address enable signal "incad_en" at its gate, a twenty-first NMOS transistor MN21 coupled between the twenty-third node N23 and a twenty-fourth node N24 and adapted to receive the internal column address signal "incad3i" at its gate, a twenty-second NMOS transistor MN22 coupled between the twenty-fourth node N24 and a twenty-fifth node N25 and adapted to receive the internal column address signal "incad3j" at its gate, and a twenty-third NMOS transistor MN23 coupled between the twenty-fifth node N25 and the ground source Vss and adapted to receive the internal column address signal "incad3k" at its gate. The seventh PMOS transistor MP7, the twentieth NMOS transistor MN20, the twenty-first NMOS transistor MN21, the twenty-second NMOS transistor MN22 and the twenty-third NMOS transistor MN23 cooperate to generate an output signal having a low logic level in response to an internal column address enable state. This signal is applied to the nineteenth node N19. The second decoder circuit 300 generates, as a final output signal, a signal "out3" via the buffers IV10 to IV12, based on the signal applied to the nineteenth node N19. The second decoder circuit 300 further includes a twenty-fourth NMOS transistor MN24 coupled between the nineteenth node N19 and a twentieth node N20 and adapted to receive the external column address enable signal "excad_en" at its gate, a twenty-fifth NMOS transistor MN25 coupled between the twentieth node N20 and a twenty-first node N21 and adapted to receive the external column address signal "excad3i" at its gate, a twenty-sixth NMOS transistor MN26 coupled between the twenty-first node N21 and a twenty-second node N22 and adapted to receive the external column address signal "excad3j" at its gate, and a twenty-seventh NMOS transistor MN27 coupled between the twenty-second node N22 and the ground voltage source Vss and adapted to receive the external column address signal "excad3k" at its gate. The seventh PMOS transistor MP7, the twenty-fourth NMOS transistor MN24, the twenty-fifth NMOS transistor MN25, the twenty-sixth NMOS transistor MN26 and the twenty-seventh NMOS transistor MN27 cooperate to generate an output signal having a low logic level in response to an external column address enable state. This signal is applied to the nineteenth node N19. The second decoder circuit 300 generates, as a final output signal, a signal "out3" based on the signal applied to the nineteenth node N19. The second decoder circuit 300 further includes an eighth PMOS transistor MP8 connected between the supply voltage source Vdd and nineteenth node N19 and adapted to receive, at its gate, an output signal from the buffer IV10 which is fed back. The reason why the eighth PMOS transistor MP8 is used is to prevent a floating phenomenon from occurring at the nineteenth node N19 after input signals having the form of pulses are enabled in response to their clock synchronization.

Figure 6:
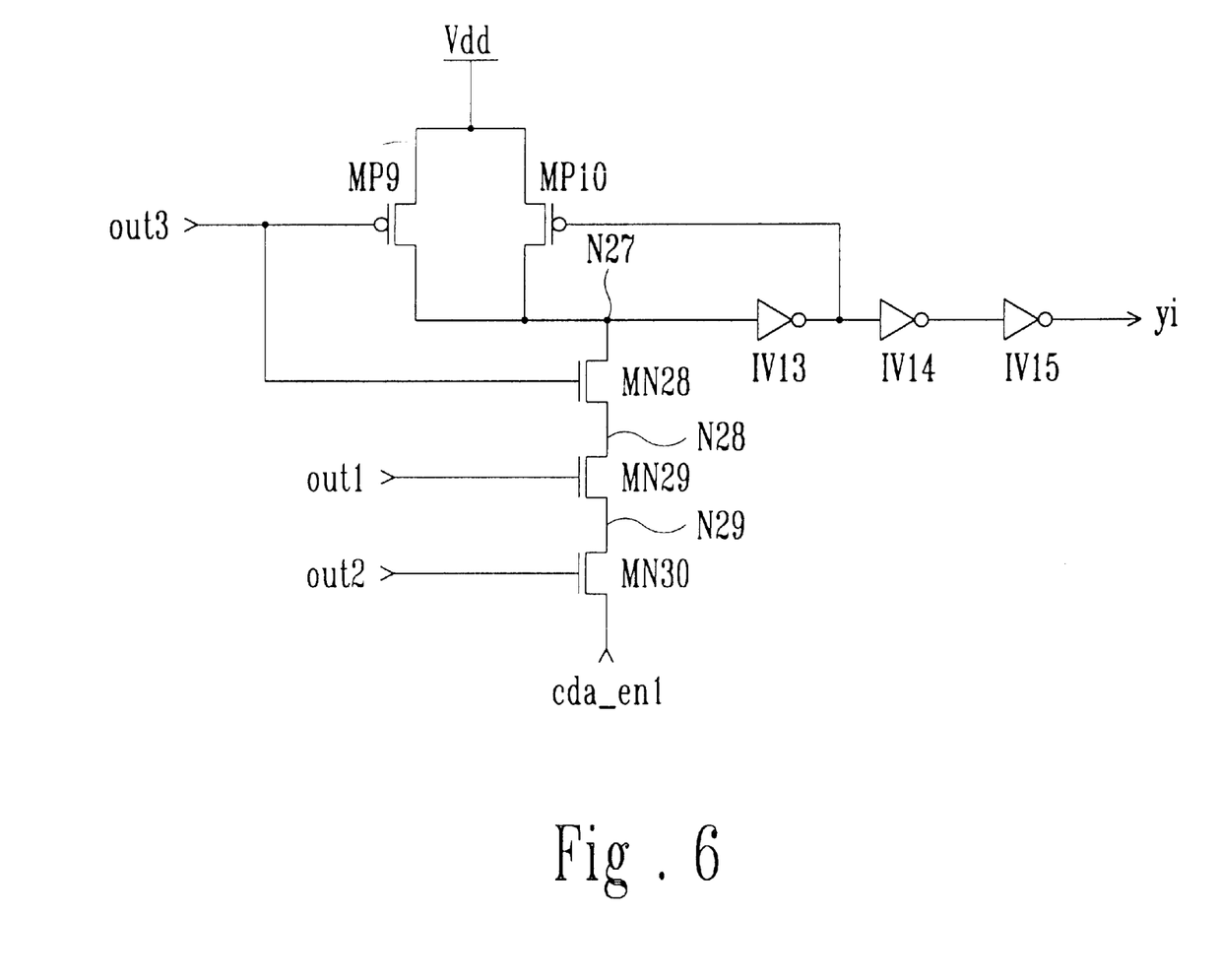
FIG. 6 is a circuit diagram illustrating a column decoder circuit shown in FIG. 1.

FIG. 6 is a circuit diagram illustrating the column decoder circuit 450 shown in FIG. 1. The column decoder circuit 450 carries out a desired decoding operation for the column decoder enable signal "cda_en1" and the signals "out1", "out2" and "out3" which are final outputs resulting from the pre-decoding operation. As shown in FIG. 6, the column decoder circuit 450 includes a ninth PMOS transistor MP9 connected in series between the supply voltage source Vdd and a twenty-seventh node N27 and adapted to receive the signal "out3" at its gate, a twenty-eighth NMOS transistor MN28 coupled between the twenty-seventh node N27 and a twenty-eighth node N28 and adapted to receive the signal "out3" at its gate, a twenty-ninth NMOS transistor MN29 coupled between the twenty-eighth node N28 and a twenty-ninth node N29 and adapted to receive the signal "out1" at its gate, and a thirtieth NMOS transistor MN30 coupled between the twenty-ninth node N29 and the ground voltage source Vss and adapted to receive the output "out2" at its gate. The ninth PMOS transistor MP9, the twenty-eighth NMOS transistor MN28, the twenty-ninth NMOS transistor MN29 and the thirtieth NMOS transistor MN30 cooperate to generate an output signal having a low logic level. This signal is applied to the twenty-seventh node N27. The column decoder circuit 450 also includes three buffers IV13 to IV15 connected in series to the twenty-seventh node N27. The column decoder circuit 450 generates, as a final output signal, a signal "yi" via the buffers IV13 to IV15, based on the signal applied to the twenty-seventh node N27. The column decoder circuit 450 further includes a tenth PMOS transistor MP10 connected between the supply voltage source Vdd and twenty-seventh node N27 and adapted to receive, at its gate, an output signal from the buffer IV13 which is fed back. The reason why the tenth PMOS transistor MP10 is used is to prevent a floating phenomenon from occurring at the twenty-seventh node N27 after input signals having the form of pulses are enabled in response to their clock synchronization.

For the simplification of description, the column decoder array of the present invention has been described as being associated with one bank, namely the eight column addresses and the eight inputs/outputs (eight dqi's). In this case, the number of the column decoders 450 included in the column decoder array is 256 ($2^n=2^8=256$).

The column decoders of the above-mentioned column decoder array are used to drive an array of divided sense amplifiers. In the block write mode, in particular, the column decoders are arranged in the form of blocks in order to select divided sense amplifiers arranged at required positions. For instance, when all inputs/outputs (namely, dq0 to dq7) associated with a column address masking are in a high logic level state, column address masking enable signals "bwdq0" to "bwdq7" have a high logic level. In this case, accordingly, 8 column decoders are enabled to carry out a block write operation for one column address. In accordance with the present invention, a column address arrangement rule is used which is adapted to arrange such 8 enabled column decoders in a distributed manner. That is, in accordance with the present invention, four enabled column decoders are arranged at the leading end portion of the column decoder array including 256 column decoders whereas the remaining four enabled column decoders are arranged at the trailing end portion of the column decoder array. These column decoders are connected to divided sense amplifiers, respectively, to drive an associated cell array.

The first or second decoder circuit included in the column decoder array of the present invention may have output lines arranged in a laterally symmetrical manner or in a shifted manner with respect to the center of the entire array.

As apparent from the above description, the present invention provides a column decoder array device in which a plurality of column decoders are arranged in a distributed manner upon driving sense amplifiers for a block write operation, thereby minimizing a current-peak value. Accordingly, it is possible to minimize the intensity of peak current which may cause a degradation in the reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A column decoder array device used in a semiconductor memory device comprising a plurality of column decoders adapted to transmit data from bit line sense amplifiers to an input or output line, further comprising:

column decoder enable means for receiving a delayed column address strobe signal and delayed block select address signals, thereby generating a control signal for enabling a column decoder array associated with a bank corresponding to the received signals;

first decoding means for receiving a normal pre-decoding enable signal, an external column address enable signal, an internal column address enable signal, external column address signals and internal column address signals, thereby generating control signals for pre-decoding a first column address group;

second decoding means for receiving the normal pre-decoding enable signal, a block write pre-decoding enable signal, a column address masking enable signal, the external column address enable signal, the internal column address enable signal, an external column address signal, and an internal column address signal, thereby generating a control signal for pre-decoding a second column address group; and column decoder group circuit for receiving the control signal from the column decoder enable means, the control signals from the first decoding means and the control signal from the second decoding means, thereby generating a control signal for transmitting data from the bit line sense amplifiers to the input or output line.

2. The column decoder array device in accordance with claim 1, wherein the first decoding means comprises a first decoder unit and a second decoder unit each adapted to carry out a pre-decoding operation for an associated portion of the first column address group divided into two portions.

3. The column decoder array device in accordance with claim 1, wherein each of the first and second decoding means has output lines coupled to the column decoder group circuit in a laterally symmetrical manner.

4. The column decoder array device in accordance with claim 1, wherein each of the first and second decoding means has output lines coupled to the column decoder group circuit in a laterally shifted manner.

* * * * *